United States Patent [19]

Frampton

[11] Patent Number: 4,622,433
[45] Date of Patent: Nov. 11, 1986

[54] CERAMIC PACKAGE SYSTEM USING LOW TEMPERATURE SEALING GLASSES

[75] Inventor: Thomas J. Frampton, Poway, Calif.

[73] Assignee: Diacon, Inc., San Diego, Calif.

[21] Appl. No.: 595,180

[22] Filed: Mar. 30, 1984

[51] Int. Cl.⁴ ............................................. H01L 23/10
[52] U.S. Cl. ................................ 174/52 FP; 29/588; 357/74; 357/78
[58] Field of Search ............... 174/52 S, 52 FP, 50.64; 357/70, 73, 74, 80, 78, 81; 361/386, 387, 399, 414; 29/582, 588, 591, 418, 827; 65/36, 42

[56] References Cited

U.S. PATENT DOCUMENTS

| | | | |
|---|---|---|---|
| 1,859,029 | 5/1932 | De Boer et al. | 252/181.6 X |
| 2,986,326 | 5/1961 | Landfors | 417/51 X |
| 3,259,490 | 7/1966 | Flaschen et al. | 357/78 X |
| 3,697,666 | 10/1972 | Wakelyn et al. | 174/50.64 X |
| 3,768,991 | 10/1973 | Rogers | 357/73 X |
| 4,141,712 | 2/1979 | Rogers | 357/73 X |
| 4,280,885 | 7/1981 | Savery | 357/78 X |
| 4,352,119 | 9/1982 | Bardens et al. | 357/78 |
| 4,426,769 | 1/1984 | Grabbe | 357/78 X |

Primary Examiner—Arthur T. Grimley
Assistant Examiner—D. A. Tone
Attorney, Agent, or Firm—Joseph H. Smith

[57] ABSTRACT

In accordance with the preferred embodiments of the invention, provided is a hermetic ceramic/glass enclosure for encapsulating semiconductor components which reduces the internal cavity moisture and contamination levels, has a stronger package seal and a lower sealing temperature than hermetic ceramic/glass enclosures currently used. Included in the first embodiment is a lower substrate, with a conductive leadframe attached thereto via devitrified glass and a layer of vitreous glass on the leadframe for attaching a cap which also includes a layer of vitreous glass. To seal the enclosure, the cap is heated to a temperature T1 above the melting point of the vitreous glass, and the lower substrate, is maintained at a temperature high enough to bond to the vitreous layer on the cap on contact, but low enough to eliminate damage to the semiconductor component and additional Gold-Silicon eutectic formation between the semiconductor component and the enclosure lower substrate. In a second embodiment, the cap includes heat treated vitreous glass that reduces contamination outgassing during the final enclosure seal process and a gettering pad disposed on the interior surface of the cap for gettering residual moisture from the internal cavity of the enclosure. A third embodiment is also provided which is especially adapted for high pin-count packages, and includes a windowframe on the top of and attached to the leadframe by devitrified glass. The windowframe has a layer of vitreous glass to facilitate final enclosure seal and a reduction in the seal area required.

19 Claims, 11 Drawing Figures

CERAMIC PACKAGE SYSTEM USING LOW TEMPERATURE SEALING GLASSES

TECHNICAL FIELD

This invention relates generally to the field of packages for semiconductor devices, and particularly to protective, hermetic ceramic enclosures using low temperature sealing glasses.

BACKGROUND OF THE INVENTION

The prior art, exemplified by U.S. Pat. No. 3,697,666, issued Oct. 10, 1972, entitled "Enclosure for Encapsulating Electrical Components" by Wakely et al., typically employs a combination of a ceramic substrate, a metal leadframe, and a devitrifying glass composition which forms a glass-to-metal seal. Conventionally, the components of such a package are placed in the proper orientation for assembly while the sealing glass remains substantially non-devitrified. The semiconductor components are then assembled into the package. The final enclosure seal, exemplified by U.S. Pat. No. 3,768,991, issued Oct. 30, 1973, entitled "Method for Sealing an Enclosure for an Electronic Component" by Bryant C. Rogers, and assigned to Diacon, Inc., typically employs heating the package and the cap to a temperature to allow the devitrifying glass to form a seal when the package and lid come in contact.

The disadvantages of the system of the prior art are: (1) high seal temperatures required for seal can damage current semiconductor components and are above the Gold-Silicon eutectic temperature (363° C.) used for semiconductor component attachment to the package which can result in semiconductor failures, (2) seal time is too short to assure that the seal glass attains full devitrification to assure a strong package seal, a particular concern for large seal areas such as high pin count packages, (3) moisture and contamination levels in the sealed enclosure cavity are high and do not meet current high reliability requirements.

The high seal temperature and package strength problems can be resolved by changing from devitrifying glass to vitreous glass. However, the moisture and contamination problems remain and additional problems are introduced. Vitreous glass, unlike devitrifying glass, will melt and reflow each time it is exposed to its melting temperature. This means that during the semiconductor assembly process (i.e. die attach, wire bonding, seal) the enclosure leadframe can shift resulting in the breaking of the tiny metal wires connecting the semiconductor component, the enclosure metal leadframe, and thus ruining the device. This shifting problem was resolved by the invention described in U.S. Pat. No. 4,141,712, entitled "Manufacturing Process for Package for Electronic Devices", issued Feb. 27, 1979, to Bryant C. Rogers and assigned to Diacon, Inc. In that system devitrifying glass was used. Again, if devitrifying glass is used, the high seal temperature and package strength problems and the other disadvantages remain.

What is required is a new package system with low seal temperatures, low moisture and contamination levels, no lead shifting during semiconductor component assembly, and optimum post seal strength.

SUMMARY OF THE INVENTION

In accordance with the preferred embodiments of the invention, provided is a hermetic ceramic/glass enclosure for encapsulating semiconductor components which reduces the internal cavity moisture and contamination levels, has a stronger package seal and a lower sealing temperature than hermetic ceramic/glass enclosures currently used.

Included in the first embodiment is a lower substrate with a conductive leadframe attached thereto via a devitrifying glass. After the leadframe is attached, the assembly is exposed to high temperature resulting in the glass becoming completely devitrified. This assures that the leadframe will not shift during subsequent exposure to high temperature and that all moisture and contaminates have been outgassed prior to the introduction of the semiconductor component. A layer of vitreous glass is applied to the assembly for attaching a cap which also includes a layer of vitreous glass. To seal the enclosure, the cap is heated to a temperature T1 above the melting point of the vitreous glass, and the lower substrate is maintained at a temperature high enough to bond to the vitreous layer on the cap on contact, but low enough to eliminate damage to the semiconductor component and additional Gold-Silicon eutectic formation between the semiconductor component and the enclosure lower substrate. Full enclosure seal strength is reached at the seal temperature through the use of vitreous glass for seal. Unlike devitrifying glass, the vitreous glass needs only to reach its melting point and attains full strength upon cool down. This provides low seal temperatures, low heat exposure times and assures seal strength which is of concern with high pin count enclosures because of the large seal areas required.

In a second embodiment, the cap includes a layer of heat treated vitreous glass. After the vitreous glass is applied to the cap, the cap is exposed to high temperature above the seal enclosure temperature to outgas moisture and contaminates. A gettering pad is deposited on the interior surface of the cap. The pad is for gettering residual moisture inside the enclosure during bake process after the enclosure is sealed. This residual moisture is introduced into the enclosure during semiconductor component assembly and must be removed to assure reliability.

A third embodiment is also provided which is especially adapted for high pin count packages, and includes a windowframe on top of and attached to the leadframe by devitrified glass. The windowframe supports the leadframe while a bonding tip support, used for holding the bonding tips of the leadframe in place, is punched out. Additionally, the windowframe reduces the final enclosure seal area allowing higher pin count applications with reliable performance. In a manner similar to the first two embodiments, the cap is sealed to the windowframe using a vitreous glass and for such an enclosure with a gettering pad, the system is post-baked as before.

DETAILED DESCRIPTION OF THE INVENTION

Figure 1:
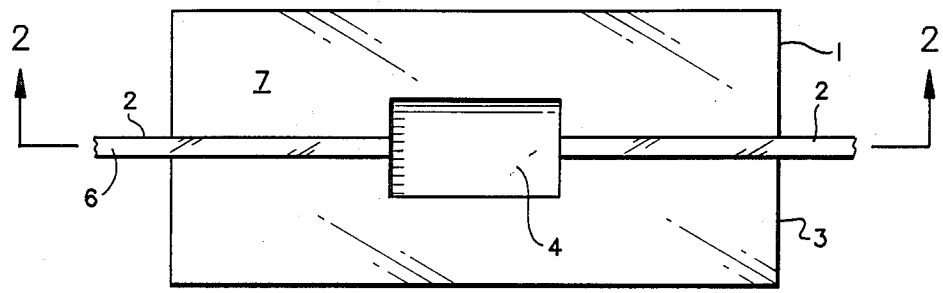
FIG. 1 shows a pictorial view of the lower substrate portion of the enclosure according to the first and second embodiments of the invention after application of a first lower portion of a composite glass layer.
Figure 2:
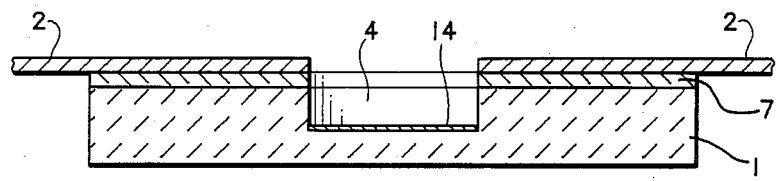
FIG. 2 is a cross-sectional view through the cut 2—2 of FIG. 1.

In accordance with the first preferred embodiment of the invention, shown in FIGS. 1 and 2 are top and cross-sectional views, respectively, of a portion of a package for encapsulating integrated circuit devices. In this first embodiment, the package includes a substrate 1, typically a ceramic; an attachment pad 14, typically gold, for attaching a semiconductor, or die, to the substrate; and a lead frame 2, imbedded in a layer of devitrified glass 7. Although lead frame 2, as an example, is shown as having only two leads, such lead frames typically have many leads. These leads extend beyond the perimeter 3 of substrate 1 and to the interior of the region of cavity 4 of the substrate.

Since the leads are for the purpose of making electrical contact, portion 5 of leads 2 adjacent to cavity 4 and portions 6 of leads 2 extending outside the perimeter of substrate 1 are kept free of glass.

To construct this portion of the package, first a slurry of devitrifying glass material 7 is silk-screened onto substrate 1 over the entire substrate except in the region of interior cavity 4. Lead frame 2 is then placed onto glass layer 7 and the entire assembly is placed in a conventional devitrification furnace, typically a belt furnace. Generally, complete devitrification requires that the temperature be increased relatively slowly, then held at a relatively high value for a period of time, and then decreased relatively slowly. For example, for a glass composition of "CV-111", sold by Owens-Illinois, it is typical to raise the temperature by 50°–100° C. per minute until a temperature of approximately 500° C. is reached, then the temperature is held relatively constant for approximately 7–9 minutes, then it is decreased at a rate of approximately 20°–50° C. per minute. Complete devitrification assures that exposure to subsequent high temperature will not allow lead movement or moisture and contaminate outgassing and maximum glass strength has been attained.

Figure 3:
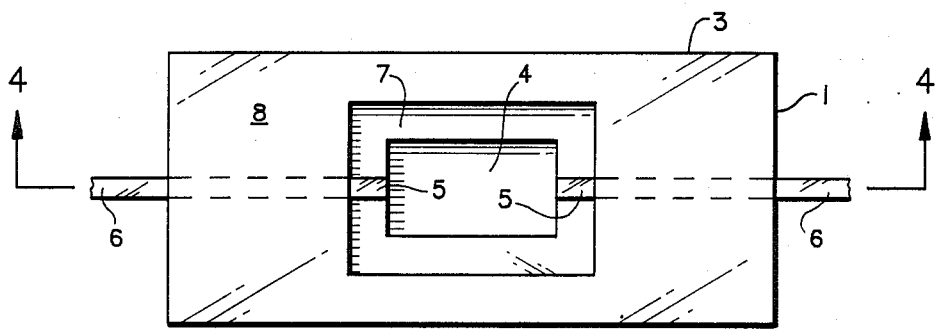
FIG. 3 is a pictorial view of the lower substrate portion of the enclosure according to the first and second embodiments of the invention after attachment of a leadframe and application of a second glass layer.
Figure 4:
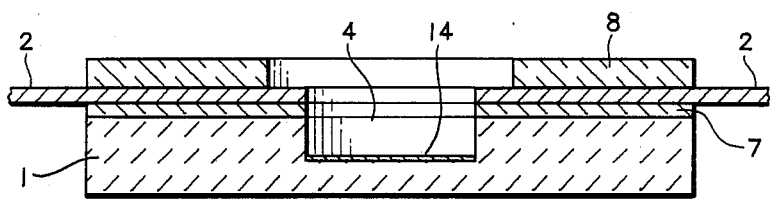
FIG. 4 is a cross-sectional view through cut line 3—3 of FIG. 3.

After substrate 1 has been removed from the devitrification oven, a second glass layer 8 is applied over the lead frame as illustrated in FIGS. 3 and 4. Unlike the prior art, however, glass layer 8 is a mixture of vitreous glass and a binder. This layer is screened on in a slurry and the system is glazed at a relatively low temperature of approximately 400° C. to remove the binder, leaving just vitreous glass for layer 8.

Vitreous glass, unlike devitrifying glass, becomes a liquid when heated and when cooled returns to its original hardened glassy state, with its strength being largely insensitive to the time it is maintained at temperature or to its rate of cooling. Devitrifying glass on the other hand becomes crystalline on heating and remains that way on cooling, so that its strength is very much affected by the degree of devitrification, which is determined by the time it is held at high temperature. These two systems can be likened to having a thermoplastic material (vitreous glass) as opposed to a thermosetting material (devitrifying glass). Some vitreous glasses which are useful in this embodiment include "KC-400" manufactured by Nippon Electric Glass and "7586" manufactured by Corning Glass Works.

Figure 5:
FIG. 5 depicts a cap according to the first embodiment of the invention.
Figure 6:
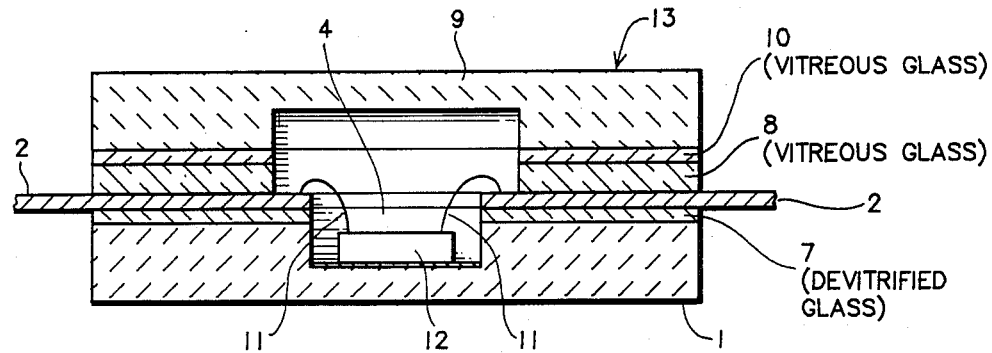
FIG. 6 is a cross-sectional view of a completed package according to the first embodiment of the invention.

To complete the package, a cap 13 is fabricated as illustrated in FIG. 5. The cap includes a substrate 9, typically ceramic, and a layer 10, again of vitreous glass. As for the bottom portion, a slurry of vitreous glass and binder is silkscreened onto the substrate and glazed, leaving just the vitreous glass deposited on the lower surface of substrate 9. After a semiconductor device, die 12 (see FIG. 6), has been attached typically by means of attaching pad 14 located in the bottom of cavity 4, the semiconductor is wire bonded by wires 11 to the leads and the cap and the bottom portion holding the die are placed in a conventional hot cap sealer. To ensure the lowest possible cavity moisture levels, the entire sealing process is carried out in a dry box system, i.e., a closed environmentally controlled container having a vacuum or an inert atmosphere. Prior to sealing, the separate lower portion with die attached and wire bonded and the separate cap are typically baked at about 150° C. to remove moisture and other undesirable materials from the package surfaces. Then cap 13 is heated to about 450° C. and the bottom portion is heated to a temperature of about 300° C. The two are placed together, vitreous layer 10 against vitreous layer 8, thereby forming a very strong, hermetic seal of vitreous glass which bonds the cap and the bottom portion together when glass layers 10 and 8 solidify as the system is cooled. FIG. 6 illustrates a completed structure according to this first embodiment of the invention.

In this first embodiment, it is preferred that vitreous layer 8 be thicker than vitreous layer 10, to help insulate the bottom portion holding the die from the higher temperature of cap 13. In this embodiment, layer 10 is about 3–5 mils thick, and layer 8 is about 6–9 mils thick. With these dimensions and using a typical ceramic substrate, it has been found that die temperatures during sealing are generally maintained below 350°. This is the result of the low sealing temperature and the low thermal conductivity of glass. Hence, circuit parameters remain substantially unaffected by the sealing process, even for circuits which are relatively sensitive to thermal cycling such as those utilizing laser trimmed resistors and Schottky diodes, and the circuit attachment will not degrade because additional Gold-Silicon eutectic will not occur.

Figure 7:
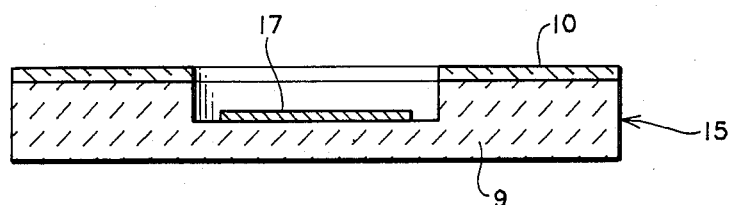
FIG. 7 depicts a cap according to the second embodiment of the invention.

A second embodiment of the invention is characterized by a cap 15 shown in FIG. 7. In this embodiment, a gettering pad 17, typically of aluminum, is vapor deposited on the inner surface of substrate 9, and then vitreous layer 10 is applied. Prior to sealing, the cap is heated in a dry environment to a temperature of about 500°–550° C., thereby obtaining a denser, dryer, glass. This pre-bake being carried out at a temperature above that used during the sealing process helps to eliminate outgassing from the cap during later processing. Sealing is then carried out as before, followed by a post-bake at a temperature of about 150° C. for about seventy-two hours, a time substantially longer than any other times involved in the process. During the post-bake, pad 17 acts as a getterer. Residual moisture in the cavity or in the internal materials becomes gaseous and tends to react with the available aluminum in the pad to form aluminum hydroxide, thus binding up whatever moisture is left in the cavity. Because device operating temperatures are generally below 150° C., subsequent moisture outgassing is minimized so that internal moisture levels do not increase notably over time. The result is a package with an exceptionally strong seal which is much dryer, and, hence, more reliable than prior packages. It should be emphasized that the package is dryer for two reasons, however. First, vitreous glass itself is generally dryer than devitrified glass, and second, the gettering activity of the aluminum pad further dries the inside of the enclosure. It should also be noted that the temperature of 150° C. for the post-bake has been chosen to be higher than the boiling point of water, 100° C., in order to gasify the moisture in the cavity but lower than the maximum limits set for interconnect bonding junctions. In a typical package, the die usually includes an aluminum bonding area for electrical connection and the leadframe bonding area is aluminum. For a gold wire interconnect between the bonding area and the leadframe, which creates a bimetal junction, the maximum allowed temperature is generally about 175° C., and for an aluminum wire interconnect, which creates a mono-metal junction, the maximum allowed temperature is generally about 200° C. Hence, the post-bake temperature could be increased up to each of these limits depending on which kind of junction is present in the package.

Figure 8:
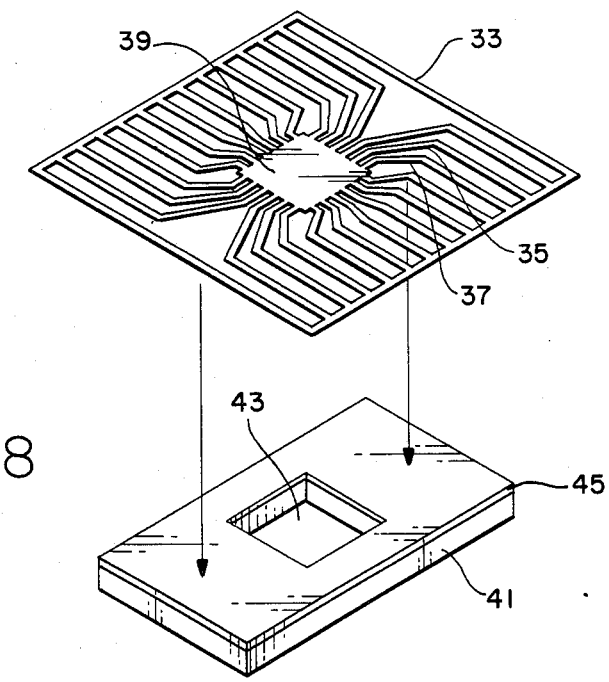
FIG. 8 shows a leadframe and window-frame according to a third embodiment of the invention.
Figure 9:
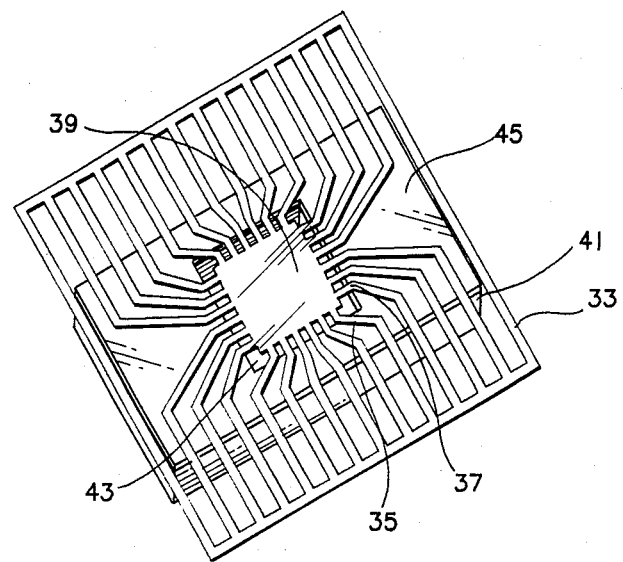
FIG. 9 shows a bottom view of the package framework in which the leadframe of FIG. 9 is attached to the windowframe.

FIGS. 8, 9, 10 and 11 illustrate various stages of construction of a third embodiment of the invention especially adapted for high pin-count integrated circuits, which combines the principles of construction described in U.S. Pat. No. 4,141,712 issued Feb. 27, 1979, entitled "Manufacturing Process for Package for Electronic Devices", by Bryant C. Rogers and assigned to Diacon, Inc. This patent is hereby incorporated by reference. In this third embodiment, a window frame 41, typically a ceramic having a window 43 therein, is prepared with a layer 45 of devitrifying glass. Leadframe 33 is laid on top of layer 45 as illustrated in FIG. 8 and the assembly is placed in a conventional devitrification furnace and heated until layer 45 is fully devitrified. (FIG. 9 shows a bottom view of the assembly after attachment.) Leadframe 33, includes bonding tips (two of which are labeled 35 and 37) terminated in a central bonding tip support 39 which is used to hold the tips in place during attachment to window frame 41.

Figure 10:
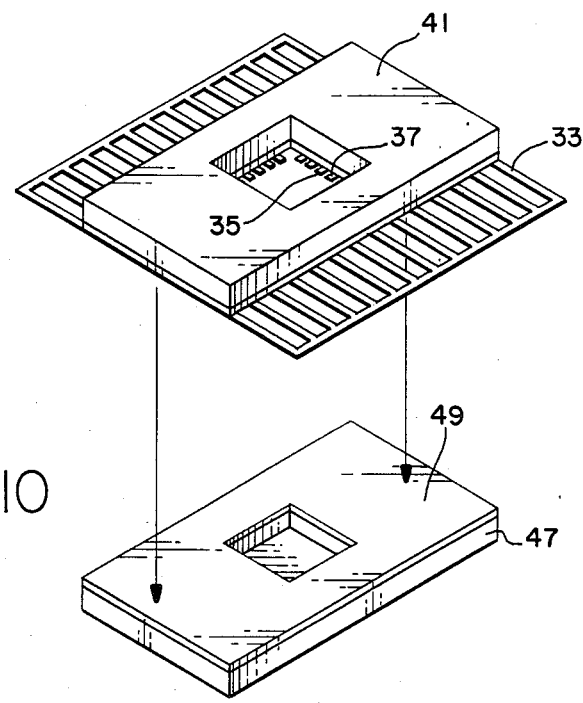
FIG. 10 shows the leadframe and windowframe package ready to be attached to a substrate.
Figure 11:
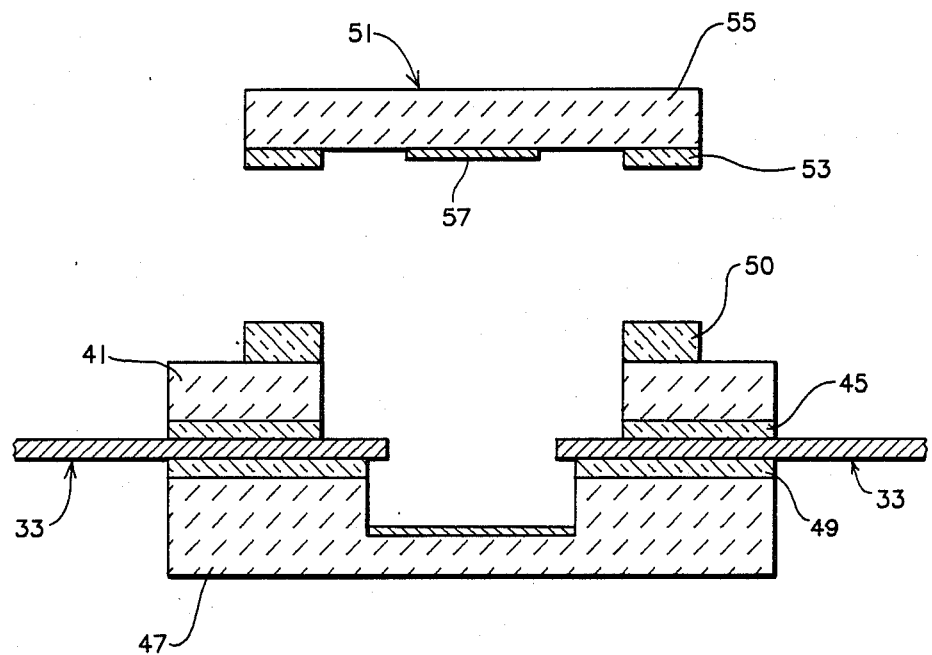
FIG. 11 shows a cross-sectional view of the third embodiment and corresponding cap in the second embodiment.

After the leadframe is attached to the windowframe, tip support 39 is removed. As illustrated in FIG. 10, this assembly is then laid on top of a substrate 47 having a layer 49 of devitrifying glass thereon. The combination of leadframe, windowframe, and substrate are heated in a devitrification furnace until layer 49 is fully devitrified. Then in accordance with the invention, layer 50 consisting of a slurry of vitreous glass and binder is placed on windowframe 41, and the entire assembly is glazed as in the first and second embodiments to remove the binder. FIG. 11 shows a cross-section of the completed bottom portion of the package and a cap 51. Similar to cap 13, cap 51 includes a layer of vitreous glass 53 on a ceramic substrate 55 and an aluminum pad 57 for gettering. The procedures for attaching the cap and bottom portion and the post-bake are the same as for the previously described embodiments.

The addition of the windowframe further enhances reliability of high pin count packages by allowing a significant reduction in seal area.

What is claimed is:

1. An enclosure for encapsulating an electronic component comprising:
   a substrate having a perimeter;
   a composite layer over said substrate, said layer having a first glass portion which is devitrified and is located over at least a part of said substrate and a second glass portion which is vitreous and is located above said first glass portion;
   a conductive lead frame attached to said substrate and imbedded in said composite layer on said substrate, said lead frame having surfaces exposed for electrical contact both within and without the perimeter of said substrate.

2. An enclosure as in claim 1 wherein said composite layer further comprises a third glass portion which is substantially devitrified adjacent said conductive lead frame, with said second glass portion thereabove.

3. An enclosure as in claim 2 wherein said composite layer further comprises a windowframe disposed between said second glass portion and said third glass portion.

4. An enclosure as in claim 3 further comprising:
   a semiconductor device attached to said substrate and electrically connected to said lead frame; and
   a cap covering said semiconductor device and sealed to said second glass portion.

5. An enclosure as in claim 4 further comprising a layer of vitreous glass attached to said cap which forms part of the seal together with said second glass portion of said composite layer.

6. An enclosure as in claim 5 wherein said cap further comprises gettering means for removing moisture from the inside of said enclosure.

7. An enclosure as in claim 5 wherein said gettering means comprises a pad of aluminum on said cap and disposed in the interior of said enclosure.

8. An enclosure as in claim 4 wherein said cap further comprises gettering means for removing moisture from the inside of said enclosure.

9. An enclosure as in claim 8 wherein said gettering means comprises a pad of aluminum on said cap and disposed in the interior of said enclosure.

10. An enclosure as in claim 1 further comprising:
    a semiconductor device attached to said substrate and electrically connected to said lead frame; and
    a cap covering said semiconductor device and sealed to said second glass portion.

11. An enclosure as in claim 10 further comprising a layer of vitreous glass attached to said cap which forms part of the seal together with said second portion of said composite layer.

12. An enclosure as in claim 11 wherein said cap further comprises metallic gettering means for removing moisture from the inside of said enclosure.

13. An enclosure as in claim 12 wherein said metallic gettering means comprises a pad of aluminum on said cap and disposed in the interior of said enclosure.

14. An enclosure as in claim 10 wherein said cap further comprises metallic gettering means for removing moisture from the inside of said enclosure.

15. An enclosure as in claim 14 wherein said gettering means comprises a pad of aluminum on said cap and disposed in the interior of said enclosure.

16. A method of sealing an enclosure for a semiconductor component, said enclosure having an upper portion with a gettering pad thereon which is disposed in an interior of the enclosure when the enclosure is sealed, said upper portion having a layer of vitreous glass thereon, and said enclosure having a lower portion holding said semiconductor component in a fixed position with said lower portion having a layer of vitreous glass thereon for affecting a hermetic seal with said upper portion, the steps comprising:
   a. heating said upper portion to a first temperature T1 greater than the melting point of said vitreous glass;
   b. heating said lower portion to a second temperature T2 which is high enough to form a bond on contact with said upper portion at temperature T1, said temperture T2 being below the gold-silicon eutectic temperature and below the temperature T1;
   c. placing said upper portion in contact with said lower portion to form a seal, after heating said upper portion to temperature T1 and said lower portion to temperature T2.

17. A method as in claim 16 further comprising:
   d. baking said sealed enclosure at a temperature T3 which is greater than 100° C., but less than 200° C.

18. A method as in claim 17 wherein said temperature T3 is less than 175° C.

19. A method as in claim 16 further comprising the step of
heating said upper portion to a temperature T4 which is higher than temperature T1 to cause outgassing from said upper portion before heating said upper portion to said temperature T1.

* * * * *